(12) United States Patent
Koike et al.

(10) Patent No.: US 8,590,342 B2
(45) Date of Patent: Nov. 26, 2013

(54) METHOD FOR PRODUCING TIO$_2$-SIO$_2$ GLASS BODY, METHOD FOR HEAT-TREATING TIO$_2$-SIO$_2$ GLASS BODY, TIO$_2$-SIO$_2$ GLASS BODY, AND OPTICAL BASE FOR EUVL

(75) Inventors: Akio Koike, Tokyo (JP); Takahiro Mitsumori, Tokyo (JP); Yasutomi Iwahashi, Tokyo (JP); Tomonori Ogawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/295,652

(22) Filed: Nov. 14, 2011

(65) Prior Publication Data

US 2012/0121857 A1 May 17, 2012

Related U.S. Application Data

(63) Continuation of application No. PCT/JP2010/057977, filed on May 11, 2010.

(30) Foreign Application Priority Data

May 13, 2009 (JP) ................................ 2009-116488

(51) Int. Cl.
*C03B 25/00* (2006.01)
*C03B 19/00* (2006.01)

(52) U.S. Cl.
USPC ................................ 65/17.3; 65/17.6; 65/117

(58) Field of Classification Search
USPC ........... 65/17.3–17.6, 413–423, 426–427, 69, 65/104, 117
See application file for complete search history.

(56) References Cited

U.S. PATENT DOCUMENTS

| 5,086,352 | A | * | 2/1992 | Yamagata et al. | ............. | 359/350 |
| 7,172,983 | B2 | * | 2/2007 | Alkemper et al. | ............. | 501/54 |
| 7,585,598 | B2 | * | 9/2009 | Maida et al. | ..................... | 430/5 |
| 8,105,734 | B2 | * | 1/2012 | Maida et al. | ..................... | 430/5 |

(Continued)

FOREIGN PATENT DOCUMENTS

| EP | 1 795 506 A1 | 6/2007 |
| JP | 2004-123420 | 4/2004 |

(Continued)

OTHER PUBLICATIONS

Fujinoki et al., JP2006240978 machine translation as provided by http://dossier1.ipdl.inpit.go.jp/AIPN/odse_top_fwi.ipdl?N0000=7401 on May 29, 2012.*

(Continued)

*Primary Examiner* — Jodi C Franklin
(74) *Attorney, Agent, or Firm* — Oblon, Spivak, McClelland, Maier & Neustadt, L.L.P.

(57) ABSTRACT

The present invention relates to a process for production of a TiO$_2$—SiO$_2$ glass body, comprising a step of, when an annealing point of a TiO$_2$—SiO$_2$ glass body after transparent vitrification is taken as $T_1$(° C.), holding the glass body after transparent vitrification in a temperature region of from $T_1$−90(° C.) to $T_1$−220(° C.) for 120 hours or more.

14 Claims, 1 Drawing Sheet

(56) References Cited

U.S. PATENT DOCUMENTS

| | | | |
|---|---|---|---|
| 2006/0179879 A1* | 8/2006 | Ellison et al. | 65/17.4 |
| 2007/0042893 A1* | 2/2007 | Koike et al. | 501/54 |
| 2007/0137252 A1 | 6/2007 | Maxon et al. | |
| 2007/0207911 A1* | 9/2007 | Koike et al. | 501/54 |

FOREIGN PATENT DOCUMENTS

| | | |
|---|---|---|
| JP | 2006-240978 | 9/2006 |
| JP | 2007-182367 | 7/2007 |
| WO | WO 03/077038 | 9/2003 |
| WO | 2006/004169 A1 | 1/2006 |
| WO | 2006/080241 A2 | 8/2006 |
| WO | WO 2010/041609 | 4/2010 |

OTHER PUBLICATIONS

International Search Report issued Jun. 22, 2010 in PCT/JP2010/057977 filed May 11, 2010.

U.S. Appl. No. 13/299,475, filed Nov. 18, 2011, Koike, et al.

Supplementary European Search Report issued Jun. 20, 2013, in European Patent Application No. 10774919.4 filed May 11, 2010.

* cited by examiner

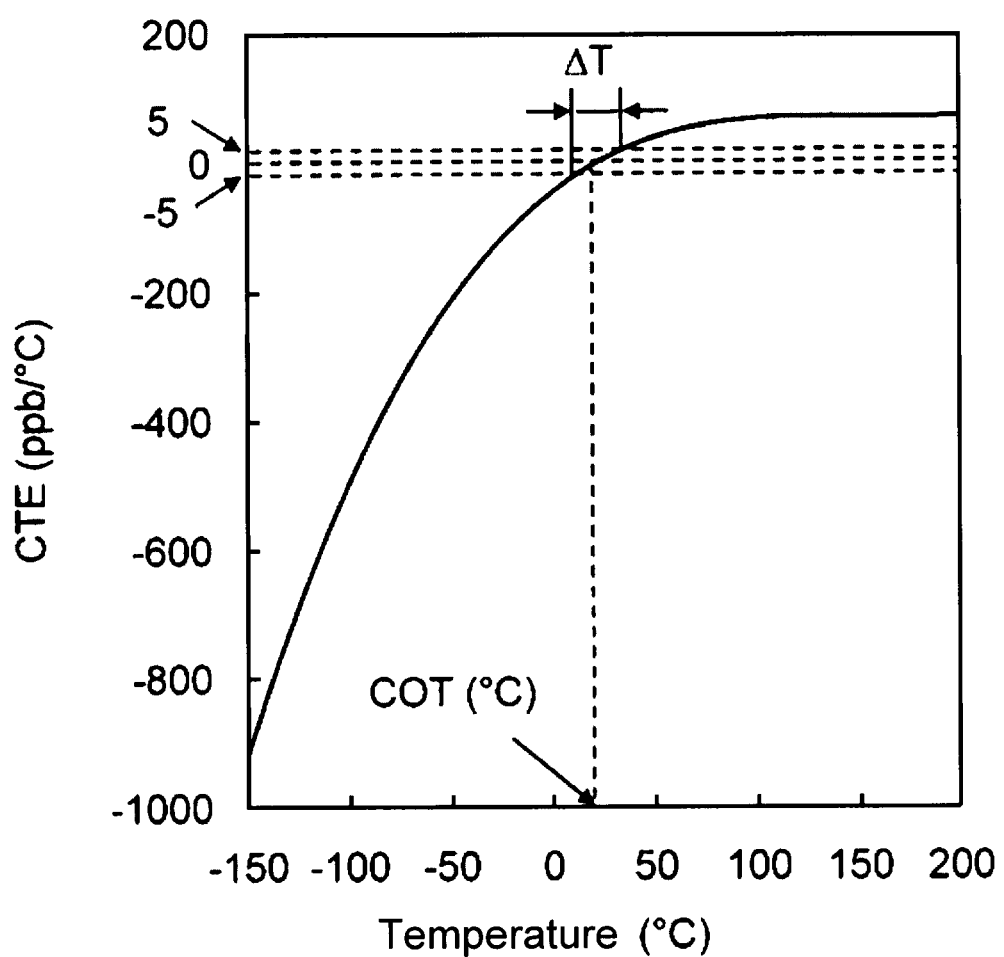

METHOD FOR PRODUCING TIO₂-SIO₂ GLASS BODY, METHOD FOR HEAT-TREATING TIO₂-SIO₂ GLASS BODY, TIO₂-SIO₂ GLASS BODY, AND OPTICAL BASE FOR EUVL

TECHNICAL FIELD

The present invention relates to a producing process and heat-treating process for a $TiO_2$—$SiO_2$ glass body.

In the present specification, the $TiO_2$—$SiO_2$ glass body means a silica glass containing $TiO_2$ as a dopant.

A $TiO_2$—$SiO_2$ glass body produced by the producing process according to the present invention and a $TiO_2$—$SiO_2$ glass body heat-treated by the heat-treating process according to the present invention are suitable as a substrate of an optical member for EUV lithography (EUVL) (an optical substrate for EUVL) such as a mask blank and a mirror.

Further, the present invention relates to such an optical base material for EUVL.

Incidentally, in the present specification, the EUV (Extreme Ultra Violet) light refers to light having a wavelength range in a soft X-ray region or a vacuum ultraviolet region, and specifically refers to light having a wavelength of from about 0.2 to 100 nm.

BACKGROUND ART

Conventionally, in the photolithography technique, an exposure device for transferring a fine circuit pattern onto a wafer and thereby producing an integrated circuit is widely utilized. With higher integration and higher functionalization of integrated circuits, the microsizing of the integrated circuit is advancing. The exposure device is hence required to form a circuit pattern with high resolution on a wafer surface in a deep focal depth, and shortening of the wavelength of the exposure light source is being advanced.

The lithography technique using a EUV light, typically a light having a wavelength of 13 nm, as an exposure light source is considered to be applicable over generations that a line width of a circuit pattern is 32 nm, and is attracting attention. The principle of image formation in the EUV lithography (hereinafter abbreviated as "EUVL") is identical with that of the conventional lithography from the viewpoint that a mask pattern is transferred using a projection optical system. However, since there is no material capable of transmitting light therethrough in the EUV light energy region, a refractive optical system cannot be used. Accordingly, the optical systems are all reflecting optical systems.

The optical system member of an exposure device for EUVL (optical member for EUVL) is such as a photomask and a mirror, and is basically configured with (1) a substrate, (2) a reflective multilayer formed on the substrate, and (3) an absorber layer formed on the reflective multilayer. For the reflective multilayer, it is investigated to form an Mo/Si reflective multilayer in which an Mo layer and an Si layer are alternately laminated, and for the absorber layer, Ta and Cr are investigated as a forming material. For the substrate used for producing an optical member for EUVL (optical substrate for EUVL), a material having a low coefficient of thermal expansion is required so as not to generate a strain even under irradiation with EUV light, and a glass and the like having a low coefficient of thermal expansion is investigated.

It is known that the coefficient of thermal expansion of the glass material is decreased by incorporating a metal dopant. In particular, a silica glass containing $TiO_2$ as a metal dopant, that is, a $TiO_2$—$SiO_2$ glass body is known as an extremely low thermal expansion material having a lower coefficient of thermal expansion than that of a silica glass. Additionally, because the coefficient of thermal expansion can be controlled by $TiO_2$ content in the silica glass, a zero expansion glass having a coefficient of thermal expansion close to zero can be obtained. Therefore, the $TiO_2$—$SiO_2$ glass has a possibility as an optical substrate for EUVL.

However, one of drawbacks of the $TiO_2$—$SiO_2$ glass body is that the glass body has striae (see Patent Document 1). The striae are inhomogeneity on composition (composition distribution) adversely affecting light transmission of an optical substrate for EUVL prepared using the glass body. The striae can be measured with a microprobe which measures composition variation correlating with variation of a coefficient of thermal expansion of several ppb/° C.

When the glass body is used in an optical substrate for EUVL, the optical surface of the optical substrate for EUVL is required to be finished such that the surface roughness (PV value: difference between the highest point (Peak) and the lowest point (Valley) in design configuration of a processed surface) is very small. However, it was found that when the surface roughness (PV value) is finished to a level of several nanometers, the striae strongly affect in some cases. The "optical surface of an optical substrate for EUVL" used herein means a film-formed surface on which a reflective multilayer film is formed, in preparing an optical member for EUVL such as a photomask or a mirror using the optical substrate for EUVL. The shape of the optical surface varies depending on the purpose of use of the optical substrate for EUVL. In the case of an optical substrate for EUVL used in the production of a photomask, the optical surface is generally a flat surface. On the other hand, in the case of an optical substrate for EUVL used in the production of a mirror, the optical surface is often a curved surface.

For this reason, to use the $TiO_2$—$SiO_2$ glass body in an optical substrate for EUVL, the striae are required to be reduced.

Patent Document 1 discloses a method for manufacturing an element for an extreme ultraviolet lithography (optical substrate for EUVL) comprising: a step of providing a silicon-containing feedstock and a titanium-containing feedstock; a step of delivering the silicon-containing feedstock and titanium-containing feedstock to a conversion site; a step of converting the silicon-containing feedstock and titanium-containing feedstock into titania-containing silica soot; a step of consolidating the titania-containing silica soot into an inclusion-free, homogeneous titanium-containing silica glass preform; and a step of finishing the titanium-containing glass preform into an element for an extreme ultraviolet lithography (optical substrate for EUVL) in which a stress caused by striae is less than 0.05 MPa.

In the method described in Patent Document 1, the conversion site has a furnace having exhaust vents and the striae level is maintained by controlling exhaust vent flow during the production process. Or, the striae level is modified by adjusting the distance between the preform and the burner. Or, the striae level is reduced by depositing the soot in a cup mounted on a vibration table and increasing the rotation rate of the vibration table.

However, to implement those methods, great modifications are required to be added to the existing facilities, which is not preferred. Furthermore, the implementation of those methods results in decrease in productivity of an optical substrate for EUVL, which is also not preferred. Additionally, the implementation of those methods, because bubbles and foreign matters are easily incorporated in a glass, is not preferred.

Patent Document 2 describes that striae of a $TiO_2$—$SiO_2$ glass body are reduced by heat-treating the $TiO_2$—$SiO_2$ glass body at a temperature higher than 1,600° C., specifically, by heat-treating in a temperature range of from 1,600 to 1,700° C. for from 48 to 1,600 hours.

According to Patent Document 2, the striae of the $TiO_2$—$SiO_2$ glass body can be reduced. However, since the heat treatment is conducted at extremely high temperature, this gives rise to the problems of foaming and subliming in the $TiO_2$—$SiO_2$ glass body, which is not preferred. Furthermore, for the heat treatment at high temperature, a carbon-made mold material must be used and a carbon furnace must be used. As a result, the peripheral portion is reduced to blacken and crystallize. This gives rise to the problems that such a glass body cannot be used as a product and a peripheral heterogeneous layer is increased.

PRIOR ART DOCUMENT

Patent Document

Patent Document 1: JP-T-2005-519349 (WO2003/77038)
Patent Document 2: US-A-2007/0137252

SUMMARY OF THE INVENTION

Problem that the Invention is to Solve

In order to solve the above-described problems of the conventional techniques, the present invention has an object to provide a process for production of a $TiO_2$—$SiO_2$ glass body having reduced influence by striae, without causing problems of modification of facilities, decrease of productivity and incorporation of bubbles and foreign matters in a glass, or problems of foaming and subliming due to heat treatment at high temperature; and a method for reducing the influence by striae of a $TiO_2$—$SiO_2$ glass body.

Means for Solving the Problems

As described above, it is known that in the case of using a $TiO_2$—$SiO_2$ glass body as an optical substrate for EUVL, striae of the $TiO_2$—$SiO_2$ glass body greatly affect the surface-finishing of the optical substrate for EUVL, but various factors participate between both. The inventors of the present invention have focused distribution of stress in a glass body caused by the striae (composition distribution) among those factors, and have made intensive investigations, thereby reaching the present invention.

Incidentally, the relationship between the striae and the distribution of stress in a glass body, and the influence to surface-finishing of an optical substrate for EUVL by the distribution of stress in a glass body are briefly described below.

The striae are composition distribution in a glass material, and a $TiO_2$—$SiO_2$ glass body having striae has several sites having different $TiO_2$ concentration. Here, the site having high $TiO_2$ concentration has negative coefficient of thermal expansion (CTE). Therefore, the site having high $TiO_2$ concentration tends to expand in an annealing step carried out in the production of a $TiO_2$—$SiO_2$ glass body. In this case, if the site having low $TiO_2$ concentration is present adjacent to the site having high $TiO_2$ concentration, expansion of the site having high $TiO_2$ concentration is inhibited, resulting in addition of compression stress. As a result, distribution of stress is generated in the $TiO_2$—$SiO_2$ glass body. In the present specification, such distribution of stress is referred to as "distribution of stress caused by striae". If such distribution of stress caused by striae is present in a $TiO_2$—$SiO_2$ glass body used as an optical substrate for EUVL, difference occurs in the processing rate when the optical surface of the optical substrate for EUVL has been subjected to finish processing, and this affects surface smoothness of the optical surface after the finish processing. According to the present invention described hereinafter, a $TiO_2$—$SiO_2$ glass body, in which its distribution of stress caused by striae has been reduced to a level free of the problem in being used as an optical substrate for EUVL, can be obtained.

The present invention provides a process for production of a $TiO_2$—$SiO_2$ glass body, containing a step of, when an annealing point of a $TiO_2$—$SiO_2$ glass body after transparent vitrification is taken as $T_1$(° C.), holding the glass body after transparent vitrification in a temperature region of from $T_1-90$(° C.) to $T_1-220$(° C.) for 120 hours or more.

In the present specification, the "annealing point" means a temperature at which the viscosity η, which is measured with a beam bending method according to the method defined in JIS R 3103-2: 2001, becomes $10^{13}$ dPa·s.

In the process for production of a $TiO_2$—$SiO_2$ glass body according to the present invention, a step of cooling the glass body after transparent vitrification up to $T_1-220$(° C.) from $T_1-90$(° C.) in an average temperature decreasing rate of 1° C./hr or less is preferably carried out as the step of holding the glass body after transparent vitrification in a temperature region of from $T_1-90$(° C.) to $T_1-220$(° C.) for 120 hours or more.

According to the process for production of a $TiO_2$—$SiO_2$ glass body according to the present invention, a $TiO_2$—$SiO_2$ glass body having a standard deviation (dev[σ]) of stress caused by striae of 0.05 MPa or less can be obtained.

Further, according to the process for production of a $TiO_2$—$SiO_2$ glass body according to the present invention, a $TiO_2$—$SiO_2$ glass body having a difference (Δσ) between the maximum value and the minimum value of stress caused by striae of 0.23 MPa or less can be obtained.

Moreover, according to the process for production of a $TiO_2$—$SiO_2$ glass body according to the present invention, a $TiO_2$—$SiO_2$ glass body of which a $TiO_2$ content is from 3 to 12% by mass and a temperature at which a coefficient of linear thermal expansion becomes 0 ppb/° C. is within a range of from 0 to 110° C. can be obtained.

Furthermore, according to the process for production of a $TiO_2$—$SiO_2$ glass body according to the present invention, a $TiO_2$—$SiO_2$ glass body of which a fictive temperature exceeds 950° C. and is lower than 1,150° C. can be obtained.

Further, the present invention provides a heat treatment process of a $TiO_2$—$SiO_2$ glass body, comprising carrying out a heat treatment containing a step of, when annealing point of a $TiO_2$—$SiO_2$ glass body to be heat-treated is taken as $T_1$(° C.), holding a $TiO_2$—$SiO_2$ glass body, which has standard deviation (dev [σ]) of stress caused by striae of 0.1 MPa or less, in a temperature region of from $T_1-90$(° C.) to $T_1-220$(° C.) for 120 hours or more, thereby decreasing the standard deviation (dev [σ]) of the stress 0.01 MPa or more lower than that before carrying out the heat treatment.

Further, the present invention provides a heat treatment process of a $TiO_2$—$SiO_2$ glass body, comprising carrying out a heat treatment containing a step of, when annealing point of a $TiO_2$—$SiO_2$ glass body to be heat-treated is taken as $T_1$(° C.), holding a $TiO_2$—$SiO_2$ glass body, which has a difference (Δσ) between the maximum value and the minimum value of stress caused by striae of 0.5 1\4 Pa or less, in a temperature region of from $T_1-90$(° C.) to $T_1-220$(° C.) for 120 hours or more, thereby decreasing the difference (Δσ) between the maximum value and the minimum value of stress 0.05 MPa or more lower than that before carrying out the heat treatment.

In the heat treatment process of a $TiO_2$—$SiO_2$ glass body according to the present invention, after heating the glass body to a temperature of $T_1-90(°C.)$ or more, a step of cooling the glass body up to $T_1-220(°C.)$ from $T_1-90(°C.)$ at an average temperature decreasing rate of 1° C./hr or less may be carried out as the heat treatment.

In the heat treatment process of a $TiO_2$—$SiO_2$ glass body according to the present invention, the $TiO_2$—$SiO_2$ glass body preferably has a $TiO_2$ content of from 3 to 12% by mass, and preferably has a temperature at which a coefficient of linear thermal expansion of the $TiO_2$—$SiO_2$ glass body after the heat treatment becomes 0 ppb/° C. being within a range of from 0 to 110° C.

In the heat treatment process of a $TiO_2$—$SiO_2$ glass body according to the present invention, the $TiO_2$—$SiO_2$ glass body preferably has, after the heat treatment, a fictive temperature of more than 950° C. and less than 1,150° C.

Further, the present invention provides a $TiO_2$—$SiO_2$ glass body obtained by the production process according to the present invention or by the heat treatment process according to the present invention.

Further, the present invention provides an optical substrate for EUV lithography (EUVL) comprising the $TiO_2$—$SiO_2$ glass body according to the present invention.

In the optical substrate for EUV lithography (EUVL) according to the present invention, the optical substrate preferably has an optical surface having PV value of surface roughness of 30 nm or less.

Moreover, in the optical substrate for EUVL according to the present invention, the optical substrate preferably has an optical surface having no defects having the greatest dimension of 60 nm or more.

Effect of the Invention

According to the production process of the present invention, a $TiO_2$—$SiO_2$ glass body in which its distribution of stress caused by striae has been reduced to a level free of the problem in being used as an optical substrate for EUVL can be produced, without causing problems of modification of facilities, decrease of productivity and incorporation of bubbles and foreign matters in a glass, or problems of foaming and subliming due to heat treatment at high temperature.

According to the heat treatment process of the present invention, the distribution of stress caused by striae in a $TiO_2$—$SiO_2$ glass body can be reduced to a level free of the problem in being used as an optical substrate for EUVL, without causing problems of modification of facilities, decrease of productivity and incorporation of bubbles and foreign matters in a glass, or problems of foaming and subliming due to heat treatment at high temperature.

The optical substrate for EUVL of the present invention is that the distribution of stress caused by striae is alleviated. Therefore, extremely smooth optical surface can be obtained when finish processing has been applied to the optical surface of the optical substrate for EUVL.

BRIEF DESCRIPTION OF THE DRAWING

FIG. 1 is a graph obtained by plotting the relationship between CTE and temperature.

MODE FOR CARRYING OUT THE INVENTION

In the present specification, ppm means ppm by mass, excluding the description of mol ppm.

The production process of a $TiO_2$—$SiO_2$ glass body of the present invention is described below.

[Production Process of $TiO_2$—$SiO_2$ Glass Body]

The production process of a $TiO_2$—$SiO_2$ glass body of the present invention can be carried out in similar procedures as in the conventional production process of a $TiO_2$—$SiO_2$ glass body, except that, when an annealing point of the $TiO_2$—$SiO_2$ glass body after transparent vitrification is taken as $T_1(°C.)$, a step of holding the glass body after transparent vitrification in a temperature region of from $T_1-90(°C.)$ to $T_1-220(°C.)$ for 120 hours or more is carried out.

The production process of a $TiO_2$—$SiO_2$ glass body of the present invention can employ a method containing the following steps (a) to (e).

Step (a)

$TiO_2$—$SiO_2$ glass fine particles (soot) obtained by flame hydrolysis or thermal decomposition of an $SiO_2$ precursor and a $TiO_2$ precursor each serving as a glass forming raw material are deposited and grown on a substrate to form a porous $TiO_2$—$SiO_2$ glass body by a soot process. The soot process includes MCVD process, OVD process and VAD process, depending on the preparation method. Of those, the VAD process is preferable because the process is excellent in mass productivity and can be provide a glass having a homogeneous composition in large in-plane area by adjusting production conditions such as a size of a substrate.

The glass forming raw materials are not particularly limited so long as those are raw materials capable of being gasified. Examples of the $SiO_2$ precursor include silicon halide compounds such as chlorides such as $SiCl_4$, $SiHCl_3$, $SiH_2Cl_2$ and $SiH_3Cl$, fluorides such as $SiF_4$, $SiHF_3$ and $SiH_2F_2$, bromides such as $SiBr_4$ and $SiHBr_3$, and iodides such as $SiI_4$; and alkoxysilane represented by $R_aSi(OR)_{4-n}$ (wherein R represents an alkyl group having 1 to 4 carbon atoms, n is an integer of from 0 to 3, and plural Rs may be same as or different from each other). Examples of the $TiO_2$ precursor include titanium halide compounds such as $TiCl_4$ and $TiBr_4$; and alkoxytitanium represented by $R_nTi(OR)_{4-n}$ (wherein R represents an alkyl group having 1 to 4 carbon atoms, n is an integer of from 0 to 3, and plural Rs may be same as or different from each other). Compounds of Si and Ti, such as silicon titanium double alkoxide, can be used as the $SiO_2$ precursor and $TiO_2$ precursor.

As the substrate, a quartz glass-made seed rod (for example, seed rod described in JP 63-B-24973 (1988)) can be used. The substrate is not limited to a rod shape, and a plate-shaped substrate may be used.

Step (b)

The porous $TiO_2$—$SiO_2$ glass body obtained in the step (a) is heated to a densification temperature in an inert gas atmosphere, an atmosphere comprising an inert gas as a main component, or a reduced-pressure atmosphere to obtain a $TiO_2$—$SiO_2$ dense body. In the present invention, the densification temperature means a temperature at which a porous glass body can be densified until pores cannot be observed with an optical microscope, and is preferably from 1,250 to 1,550° C., and particularly preferably from 1,350 to 1,450° C. The treatment is preferably conducted in such an atmosphere under a pressure of about from 10,000 to 200,000 Pa. The term "Pa" in the present specification means an absolute pressure, not a gate pressure. The inert gas is preferably helium.

Further, in the step (b), it is preferred that the porous $TiO_2$—$SiO_2$ glass body is placed under reduced pressure (preferably 13,000 Pa or less, particularly 1,300 Pa or less), and an inert gas or a gas comprising an inert gas as a main component is then introduced to form an atmosphere of a given pressure, because homogeneity of the $TiO_2$—$SiO_2$ dense body is increased.

In this case, if the above procedures are carried out in a water vapor-containing atmosphere to introduce OH groups in the $TiO_2$—$SiO_2$ glass body as described hereinafter, it is preferred that the porous $TiO_2$—$SiO_2$ glass body is placed under reduced pressure, and an inert gas containing the inert gas and water vapor, or water vapor is then introduced until reaching a given water vapor partial pressure, thereby forming a water vapor-containing atmosphere.

Furthermore, in the step (b), it is preferred that the porous $TiO_2$—$SiO_2$ glass body is held at room temperature or a temperature lower than the densification temperature in an inert gas atmosphere, an atmosphere comprising an inert gas as a main component, or under reduced pressure, and then heated to the densification temperature, because homogeneity of the $TiO_2$—$SiO_2$ dense body is increased.

In this case, if the above procedures are carried out in a water vapor-containing atmosphere, it is preferred that the porous $TiO_2$—$SiO_2$ glass body is held at room temperature or a temperature lower than the densification temperature in a water vapor-containing atmosphere, and the temperature thereof is then increased to the densification temperature.

In order to improve visible light transmission, it is preferred that the porous $TiO_2$—$SiO_2$ glass body is held at room temperature or a temperature lower than the densification temperature in an oxygen-containing atmosphere, and the temperature thereof is then increased to the densification temperature. Alternatively, the temperature of the porous $TiO_2$—$SiO_2$ glass body is increased to the densification temperature in an inert atmosphere containing oxygen, thereby obtaining a $TiO_2$—$SiO_2$ dense body. The inert atmosphere containing oxygen is preferably an inert atmosphere containing 20% by volume or less of oxygen, more preferably an inert atmosphere containing 10% by volume or less of oxygen, and particularly preferably an inert atmosphere containing 5% by volume or less of oxygen.

Step (c)

The $TiO_2$—$SiO_2$ dense body obtained in the step (b) is heated to a transparent vitrification temperature to obtain a transparent $TiO_2$—$SiO_2$ glass body. In the present specification, the transparent vitrification temperature means a temperature at which crystals cannot be confirmed by an optical microscope and a transparent glass is obtained, and is preferably from 1,350 to 1,750° C., and particularly preferably from 1,400 to 1,700° C.

The atmosphere is preferably an atmosphere of 100% inert gas such as helium or argon, or an atmosphere comprising an inert gas such as helium or argon as a main component. The pressure may be reduced pressure or ordinary pressure. In the case of reduced pressure, the pressure is preferably 13,000 Pa or lower.

Step (d)

The transparent $TiO_2$—$SiO_2$ glass body obtained in the step (c) is placed in a mold, heated to a temperature higher than the softening point, and molded into a desired shape, thereby obtaining a molded $TiO_2$—$SiO_2$ glass. The molding temperature is preferably from 1,500 to 1,800° C. When the molding temperature is 1,500° C. or higher, viscosity of the transparent $TiO_2$—$SiO_2$ glass body is sufficiently decreased to such an extent that the glass deforms by the weight itself. Furthermore, growth of cristobalite which is a crystal phase of $SiO_2$, or growth of rutile or anatase which is a crystal phase of $TiO_2$ is hard to occur, and the occurrence of a so-called devitrification can be prevented. When the molding temperature is 1,800° C. or lower, sublimation of $SiO_2$ is inhibited.

The above procedures may be repeated more than once. That is, two-stage molding may be performed such that after the transparent $TiO_2$—$SiO_2$ glass body is placed in a mold and heated to a temperature higher than the softening point, the molded body obtained is placed in another mold and heated to a temperature higher than the softening point.

Incidentally, the step (c) and the step (d) can be conducted sequentially or simultaneously.

Further, if the glass obtained in the step (c) has sufficiently large size, the step (d) is not conducted, and the transparent $TiO_2$—$SiO_2$ glass body obtained in the step (c) is cut into a given size, thereby a molded $TiO_2$—$SiO_2$ glass body can be obtained.

Step (e)

The $TiO_2$—$SiO_2$ glass body after the transparent vitrification is held in a temperature region of from $T_1-90$(° C.) to $T_1-220$(° C.) for 120 hours or more. Here, $T_1$ is an annealing point (° C.) of a $TiO_2$—$SiO_2$ glass body after transparent vitrification.

By carrying out the step (e), distribution of stress caused by striae in the $TiO_2$—$SiO_2$ glass body can be reduced to a level free of problem in being used as an optical substrate for EUVL. In this case, the point of the extent to which the distribution of stress caused by striae is reduced is described hereinafter.

Specific procedures of the step (e) are not particularly limited so long as the $TiO_2$—$SiO_2$ glass body after the transparent vitrification can be held in a temperature region of from $T_1-90$(° C.) to $T_1-220$(° C.) for 120 hours or more. Therefore, the molded $TiO_2$—$SiO_2$ glass body obtained in the step (d) may be heated to a certain temperature in the temperature region of from $T_1-90$(° C.) to $T_1-220$(° C.), and held at the temperature for 120 hours or more. Furthermore, from the viewpoint that the $TiO_2$—$SiO_2$ glass body after transparent vitrification is held in a temperature region of from $T_1-90$(° C.) to $T_1-220$(° C.) for 120 hours or more, the step (e) may be carried out as the step (c) or the step (d), or the step (e) may be carried out as the step (c) and the step (d) that are continuously carried out.

However, in the general production process of a $TiO_2$—$SiO_2$ glass body, an annealing step is generally conducted after carrying out the step (d), and the temperature of the molded $TiO_2$—$SiO_2$ glass body at the time of completion of the step (d) is generally higher than $T_1-90$(° C.). Therefore, the step (e) is preferably carried out as the annealing step.

When the step (e) is carried out as an annealing step, the annealing may be conducted such that the time required to cool the molded $TiO_2$—$SiO_2$ glass body obtained in the step (d) up to $T_1-220$(° C.) from $T_1-90$(° C.) is 120 hours or more. To carry out the annealing under such conditions, the annealing up to $T_1-220$(° C.) from $T_1-90$(° C.) may be conducted in an average temperature decreasing rate of 1° C./hr or less.

When the step (e) is carried out as an annealing step, the molded $TiO_2$—$SiO_2$ glass body is more preferably cooled up to $T_1-220$(° C.) from $T_1-90$(° C.) in an average temperature decreasing rate of 0.95° C./hr or less, further preferably cooled in an average temperature decreasing rate of 0.9° C./hr or less, and particularly preferably cooled in an average temperature decreasing rate of 0.85° C./hr or less.

Incidentally, when the step (e) is carried out as an annealing step, the annealing is not necessarily required to be carried out in a constant temperature decreasing rate so long as the time required to cool the molded $TiO_2$—$SiO_2$ glass body up to $T_1-220$(° C.) from $T_1-90$(° C.) is 120 hours or more. Therefore, the step (e) may have a stage of holding at a constant temperature or a stage of heating, in the course of annealing. However, in the case of having the stage of heating, the highest temperature at the time of the heating is required to be a temperature lower than $T_1-90(°\text{C}.)$.

When the step (e) is carried out as an annealing step, the molded $TiO_2$—$SiO_2$ glass body may be naturally cooled after the temperature thereof reaches $T_1-220(°\text{C}.)$.

In order to eliminate inclusions such as foreign matters and bubbles from the $TiO_2$—$SiO_2$ glass to be produced, it is required in the production steps described above to inhibit contamination particularly in the step (a), and to precisely control the temperature conditions of the steps (b) to (d).

The procedures of producing a $TiO_2$—$SiO_2$ glass body by the soot process is described above, but the procedures are not limited to this, and the $TiO_2$—$SiO_2$ glass body can be produced by a direct process. In this case, a transparent $TiO_2$—$SiO_2$ glass body is directly obtained by hydrolyzing/oxidizing a silica precursor and a titania precursor each serving as a glass forming raw material in oxyhydrogen flame of from 1,800 to 2,000° C. in the above step (a). The transparent $TiO_2$—$SiO_2$ glass body obtained contains OH. In this case, OH concentration of the transparent $TiO_2$—$SiO_2$ glass body can be controlled by adjusting a flame temperature and a gas concentration. That is, the transparent $TiO_2$—$SiO_2$ glass body can be obtained by the step (a) without conducting the step (b) and the step (c), and after obtaining a molded $TiO_2$—$SiO_2$ glass body by the step (d), the step (e) may be carried out. Furthermore, after obtaining the molded $TiO_2$—$SiO_2$ glass body by cutting the transparent $TiO_2$—$SiO_2$ glass body obtained in the step (a) into a given size, the step (e) may be carried out. Alternatively, the annealing may be conducted such that the time required to cool the transparent $TiO_2$—$SiO_2$ glass body obtained in the step (a) up to $T_1-220(°\text{C}.)$ from $T_1-90(°\text{C}.)$ is 120 hours or more.

According to the production process of the present invention, the $TiO_2$—$SiO_2$ glass body in which distribution of stress caused by striae has been reduced to a level free of problem in being used as an optical substrate for EUVL can be obtained by carrying out the step (e).

Specifically, the $TiO_2$—$SiO_2$ glass body obtained by the production process of the present invention preferably has standard deviation (dev[σ]) of stress caused by striae of 0.05 MPa or less, more preferably 0.04 MPa or less, and further preferably 0.03 MPa or less.

Alternatively, the $TiO_2$—$SiO_2$ glass body obtained by the production process of the present invention preferably has a difference (Δσ) between the maximum value and the minimum value of stress caused by striae of 0.23 MPa or less, more preferably 0.2 MPa or less, and further preferably 0.15 MPa or less.

In this case, the stress of the $TiO_2$—$SiO_2$ glass body can be obtained by the conventional method. For example, retardation is obtained by measuring a region of about 1 mm×1 mm by using a birefringence microscope, and the stress is obtained by the following equation.

$$\Delta = C \times F \times n \times d$$

wherein Δ is retardation, C is a photoelastic constant, F is stress, n is a refractive index, and d is a thickness of a sample.

Profile of stress is obtained by the above method, and the standard deviation (dev[σ]) of stress and the difference (Δσ) between the maximum value and the minimum value of stress can be obtained from the profile. More specifically, a cube of, for example, about 40 mm×40 mm×40 mm is cut out of a transparent $TiO_2$—$SiO_2$ glass body, the cube is sliced from each surface thereof in a thickness of about 1 mm, followed by polishing, therefore obtaining a plate-shaped $TiO_2$—$SiO_2$ glass block of 30 mm×30 mm×0.5 mm. Using a birefringence microscope, helium neon laser light is vertically applied to a 30 mm×30 mm surface of the glass block, in-plane retardation distribution is examined by magnifying to the magnification capable of observing the striae well, and the retardation distribution is converted to stress distribution. When pitch of striae is fine, the thickness of the plate-shaped $TiO_2$—$SiO_2$ glass brook to be measured is required to be small.

In the $TiO_2$—$SiO_2$ glass body, at least in the case of the stress measured by the above measurement method, stress caused by other factors can be negligible level, as compared with the stress caused by striae. Therefore, the stress obtained by the above method substantially equals to the stress caused by striae.

Properties preferably possessed by the $TiO_2$—$SiO_2$ glass body obtained by the production process of the present invention are described below.

When the $TiO_2$—$SiO_2$ glass body obtained by the production process of the present invention is used as an optical substrate for EUVL, the $TiO_2$—$SiO_2$ glass body is required to have low coefficient of thermal expansion. In this case, it is in a temperature region in which the $TiO_2$—$SiO_2$ glass body undergoes in being used as an optical substrate for EUVL that the $TiO_2$—$SiO_2$ glass body is required to have low coefficient of thermal expansion. In this regard, the $TiO_2$—$SiO_2$ glass body preferably has a temperature (Cross-over Temperature: COT) at which a coefficient of thermal expansion (CTE) becomes 0 ppb/° C. being within a range of from 0 to 110° C.

When used as a photomask, COT of the $TiO_2$—$SiO_2$ glass body is preferably within a range of from 15 to 35° C., further preferably 22±3° C., and particularly preferably 22±2° C. On the other hand, in the case that the temperature of a substrate is estimated to become higher than 22±3° C. as in the case of, for example, a mirror used in EUV stepper, the COT is preferably in a range of ±3° C. to the estimation temperature $T_{est}$, that is, $T_{est}±3°$ C. The COT is more preferably $T_{est}±2°$ C. In the case that the $T_{est}$ is not determined clearly, the COT is more preferably within a range of from 40 to 110° C., further preferably within a range of from 45 to 100° C., and particularly preferably within a range of from 50 to 80° C.

Further, when the $TiO_2$—$SiO_2$ glass body obtained by the production process of the present invention is used as an optical substrate for EUVL, the $TiO_2$—$SiO_2$ glass body preferably has a broad range in which the CTE is substantially zero. Specifically, temperature width ΔT in which CTE is 0±5 ppb/° C. is 5° C. or more is preferred.

The ΔT of glass materials constituting an optical substrate for EUVL is more preferably 6° C. or more, further preferably 8° C. or more, and particularly preferably 15° C. or more.

Further, when the $TiO_2$—$SiO_2$ glass body obtained by the production process of the present invention is used as an optical substrate for EUVL, the $TiO_2$—$SiO_2$ glass body preferably has an average CTE of from 20 to 100° C. being 70 ppb/° C. or less, more preferably 50 ppb/° C. or less, and further preferably 40 ppb/° C. or less. Furthermore, the $TiO_2$—$SiO_2$ glass body preferably has an average CTE of from 20 to 100° C. being −120 ppb/° C. or more, more preferably −100 ppb/° C. or more, and further preferably −60 ppb/° C. or more.

The COT, ΔT and average CTE of from 20 to 100° C., of the $TiO_2$—$SiO_2$ glass body can be obtained by measuring CTE of the $TiO_2$—$SiO_2$ glass body by a conventional method, such as using a laser interference thermal dilatometer, in a range of from −150 to +200° C., and plotting the relationship between CTE and temperature as shown in FIG. 1.

It is known that a coefficient of thermal expansion of the $TiO_2$—$SiO_2$ glass changes, depending on a concentration of $TiO_2$ contained (for example, see P. C. Schultz and H. T. Smyth, in: R. W. Douglas and B. Ellis, Amorphous Materials, Willy, New York, p. 453 (1972)). Therefore, COT of the $TiO_2$—$SiO_2$ glass can be controlled by controlling $TiO_2$ content in the $TiO_2$—$SiO_2$ glass.

In order that COT of the $TiO_2$—$SiO_2$ glass may be fallen within a range of from 0 to 110° C., the $TiO_2$ content must be from 3 to 12% by mass. Where the $TiO_2$ content is less than 3% by mass, COT tends to be less than 0° C. Where the $TiO_2$ content exceeds 12% by mass, COT tends to exceed 110° C., or the glass tends to exhibit negative expansion in the overall region in a temperature range of from −150 to 200° C. Furthermore, there are possibilities that crystals such as rutile are easily precipitated or bubbles easily remain.

The $TiO_2$ content is preferably 11% by mass or less, and more preferably 10% by mass or less. Furthermore, the $TiO_2$ content is preferably 4% by mass or more, and more preferably 5% by mass or more. When COT is adjusted in a range of 15 to 35° C., the $TiO_2$ content is particularly preferably 6% by mass or more and less than 7.5% by mass. On the other hand, in the case that $T_{est}$ is from 40 to 110° C. as in the case of a mirror used in EUV stepper, the $TiO_2$ content is particularly preferably 8% by mass or more and less than 10% by mass.

The $TiO_2$—$SiO_2$ glass body may contain OH group. Owing to the presence of OH group, structural relaxation of a glass is promoted, and glass structure having low fictive temperature is liable to be realized. Therefore, introducing OH group is an effective means to decrease the fictive temperature of the $TiO_2$—$SiO_2$ glass body. When the $TiO_2$—$SiO_2$ glass body contains OH group, the OH concentration is preferably 600 ppm or more on achieving the above fictive temperature range, and the OH concentration is more preferably 700 ppm or more, further preferably 800 ppm or more, still further preferably 900 ppm or more, and particularly preferably 1,000 ppm or more.

However, in order to prevent outgas in a film formation process, during irradiation of high energy light in EUV stepper, or the like, the OH concentration is preferably less than 600 ppm, more preferably less than 200 ppm, and particularly preferably less than 100 ppm.

The OH concentration of a $TiO_2$—$SiO_2$ glass body can be measured using the conventional method. For example, the measurement by an infrared spectrophotometer is conducted, and the OH concentration can be obtained from an absorption peak at a wavelength of 2.7 μm (J. P. Williams et al., American Ceramic Society Bulletin, 55 (5), 524, 1976). The detection limit by this method is 0.1 ppm.

To introduce OH group in a $TiO_2$—$SiO_2$ glass body, the step (b) is preferably carried out in a water vapor-containing atmosphere. The water vapor-containing atmosphere is preferably an inert gas atmosphere having a water vapor partial pressure ($p_{H2O}$) of 5,000 Pa or more, and more preferably an inert gas atmosphere having a water vapor partial pressure ($p_{H2O}$) of 10,000 Pa or more. The inert gas is preferably helium.

The $TiO_2$—$SiO_2$ glass body may contain fluorine (F) by F-doping. It is already known that structural relaxation of a glass is affected by introducing F (Journal of Applied Physics 91 (8), 4886 (2002)). According to this, by introducing F, structural relaxation is promoted, and glass structure having low fictive temperature is easily achieved (first effect). Therefore, F-doping is an effective means to decrease the fictive temperature of the $TiO_2$—$SiO_2$ glass body. It is further considered that F-doping has an effect to broaden the range of ΔT (second effect).

When F is introduced in the $TiO_2$—$SiO_2$ glass body, the F concentration is preferably 3,000 ppm or more, more preferably 5,000 ppm or more, and particularly preferably 7,000 ppm or more.

The F concentration can be measured with the conventional method, and for example, can be measured by the following procedures. The $TiO_2$—$SiO_2$ glass body is heated and melted with anhydrous sodium carbonate, and distilled water and hydrochloric acid are added to the resulting melt in a volume ratio to the melt of 1, respectively, thereby preparing a sample liquid. Electromotive force of the sample liquid is measured by radiometer using a fluorine ion selective electrode, and No. 945-220 and No. 945-468, manufactured by Radiometer Trading, as a comparative electrode, respectively, and a fluorine content is obtained based on a calibration curve previously prepared using fluorine ion standard solutions (Journal of The Chemical Society of Japan, 1972 (2), 350). The detection limit by this method is 10 ppm.

When F is introduced in the $TiO_2$—$SiO_2$ glass body, variation of fluorine concentration in the glass body, that is, deviation width AF of the fluorine concentration, is preferably within ±10%, more preferably within ±8%, further preferably within ±5%, and particularly preferably within ±3%, to the average value of the amount of fluorine introduced. For example, in the case of the $TiO_2$—$SiO_2$ glass body in which the amount of fluorine introduced is 1,000 ppm, the amount of fluorine introduced is preferably within a range of from 900 ppm to 1,100 ppm, and particularly preferably within a range of from 970 ppm to 1,030 ppm.

In order to introduce F in a $TiO_2$—$SiO_2$ glass body, there are methods in which in the step (a), an $SiO_2$ precursor and/or a $TiO_2$ precursor each serving as a glass forming material, containing F are used or the $SiO_2$ precursor and the $TiO_2$ precursor are subjected to flame hydrolysis or thermal decomposition in an F-containing atmosphere, thereby obtaining a porous $TiO_2$—$SiO_2$ glass body containing F. Furthermore, there are methods in which in a direct process, an $SiO_2$ precursor and/or a $TiO_2$ precursor each serving as a glass forming material, containing F are used or the $SiO_2$ precursor and the $TiO_2$ precursor are subjected to hydrolysis/oxidation in oxyhydrogen flame of 1,800 to 2,000° C. in an F-containing atmosphere, thereby obtaining a $TiO_2$—$SiO_2$ glass body containing F.

Incidentally, the F-containing atmosphere is an atmosphere of F-containing gas (for example, $SiF_4$, $SF_6$, $CHF_3$, $CF_4$, $C_2F_6$, $C_3F_8$ or $F_2$), or a mixed gas atmosphere of F-containing gas diluted with an inert gas.

There is a method of obtaining an F-containing porous $TiO_2$—$SiO_2$ glass body by holding the porous $TiO_2$—$SiO_2$ glass body in the F-containing atmosphere before carrying out the step (b). In this case, the porous $TiO_2$—$SiO_2$ glass body is held in a reaction vessel having F-containing inner atmosphere at a given temperature for a given period of time.

However, in the case of carrying out this procedure, the reaction which forms HF is involved. Therefore, it is preferred that a solid metal fluoride is arranged in the reaction vessel, and HF generated in the reaction field is adsorbed on the solid metal fluoride.

In the case of carrying out this procedure, the temperature in the reaction vessel is not particularly limited. However, the adsorbability of HF by the solid metal fluoride is improved as the temperature in the reaction vessel is decreased, so that it is preferred.

From this standpoint, the temperature is preferably 200° C. or lower, more preferably 150° C. or lower, and further preferably 100° C. or lower. On the other hand, fluorine easily diffuses to inside of the porous glass body as the temperature is increased, and the introduction reaction time of fluorine in the porous glass body is shortened as the temperature in the reaction vessel is increased, so that it is preferred. From this standpoint, the temperature is preferably −50° C. or higher, more preferably 0° C. or higher, and further preferably 20° C. or higher.

In the case of carrying out this procedure, the pressure in the reaction vessel is not particularly limited. However, to efficiently adsorb HF, it is preferred that diffusion of HF from the inside of the porous glass is promoted, and from this standpoint, lower pressure in the reaction vessel is preferred. The pressure in the reaction vessel is preferably 1 MPa or lower, more preferably 0.6 MPa or lower, and further preferably 0.3 MPa or lower, in gauge pressure. On the other hand, when the pressure in the reaction vessel is reduced pressure, there is a possibility of suctioning external air in the reaction vessel. Moisture, volatile organic matters and the like, contained in the external air are reacted with elemental fluorine ($F_2$) to form HF. Therefore, it is preferred to avoid suction of the air. From this standpoint, the pressure in the reaction vessel is preferably 0 MPa or higher in gauge pressure.

In the case of using a mixed gas of $F_2$ diluted with an inert gas, the concentration of $F_2$ in the mixed gas is preferably from 100 mol ppm to 50 mol %, and more preferably from 1,000 mol ppm to 20 mol %, from the standpoints of easy control of a reaction and economic efficiency. Where the concentration is less than 100 mol ppm, a rate for introducing fluorine in the porous glass body becomes slow and a treatment time becomes long. On the other hand, where the concentration exceeds 50 mol %, a rate for introducing fluorine in the porous glass body becomes fast and it becomes difficult to control the reaction.

Further, in the case of carrying out this procedure, the time of contacting $F_2$ with the porous glass body in the reaction vessel is preferably from 1 minute to 1 week, and particularly preferably from 10 minutes to 2 days.

In the case of using the $TiO_2$—$SiO_2$ glass body as an optical substrate for EUVL, fictive temperature of the $TiO_2$—$SiO_2$ glass body preferably exceeds 950° C. and is less than 1,150° C. When the fictive temperature of the $TiO_2$—$SiO_2$ glass body is in the above range, there are advantages that the average CTE of from 20 to 100° C. of the glass body is decreased and ΔT of the glass body broadens.

When the fictive temperature of the $TiO_2$—$SiO_2$ glass body exceeds 950° C., decrease in density and decrease in Young's modulus are suppressed, Vickers Hardness is increased, and the glass surface is difficult to be scratched. More preferably, the fictive temperature of the $TiO_2$—$SiO_2$ glass body exceeds 960° C. On the other hand, when the fictive temperature of the $TiO_2$—$SiO_2$ glass body is lower than 1,150° C., there are advantages that the average CTE of from 20 to 100° C. of the glass material is decreased, and ΔT of the glass body of the glass body broadens. The fictive temperature of the $TiO_2$—$SiO_2$ glass body is more preferably lower than 1,100° C., further preferably lower than 1,070° C., and particularly preferably lower than 1,000° C.

The fictive temperature of the $TiO_2$—$SiO_2$ glass body can be measured by the known procedures. For example, the fictive temperature of the $TiO_2$—$SiO_2$ glass body can be measured by the following procedures.

Absorption spectrum of a mirror-polished $TiO_2$—$SiO_2$ glass body is obtained using an infrared spectrophotometer (in the Examples described hereinafter, Magna 760 manufactured by Nikolet was used). In this case, the data interval is adjusted about 0.5 $cm^{-1}$, and an average value after scanning 64 times is used for the absorption spectrum. In the infrared absorption spectrum thus obtained, the peak observed in the vicinity of about 2,260 $cm^{-1}$ is derived from harmonic of stretching vibration induced by the Si—O—Si bond of the $TiO_2$—$SiO_2$ glass. Using this peak position, calibration curve is prepared from glasses having known fictive temperature and the same composition, and the fictive temperature is determined. Incidentally, the shift of a peak position due to the change of a glass composition can be extrapolated from composition dependency of the calibration curve.

In the case of using the $TiO_2$—$SiO_2$ glass body as an optical substrate for EUVL, it is important, in the standpoint of decreasing variation of coefficient of thermal expansion in the $TiO_2$—$SiO_2$ glass body, to uniform the compositional ratio in the $TiO_2$—$SiO_2$ glass body, specifically, the compositional ratio between $TiO_2$ and $SiO_2$ ($TiO_2/SiO_2$).

In the case of using the $TiO_2$—$SiO_2$ glass body as an optical substrate for EUVL, the variation of the fictive temperature in the $TiO_2$—$SiO_2$ glass body is preferably within 50° C., and more preferably within 30° C. Where the variation of the fictive temperature exceeds the above range, difference may occur in coefficient of thermal expansion, depending to the place.

In the present specification, the "variation of the fictive temperature" is defined as the difference between the maximum value and the minimum value of the fictive temperature in an area of 30 mm×30 mm in at least one plane.

The variation of fictive temperature can be measured as follows. A $TiO_2$—$SiO_2$ glass body molded into a given size is sliced to obtain a block of 50 mm×50 mm×6.35 mm. The fictive temperature is measured on a plane of 50 mm×50 mm of the block at an interval of 10 mm pitch according to the above-described method. Thus, the variation of the fictive temperature of the $TiO_2$—$SiO_2$ glass body is obtained.

The heat treatment process of a $TiO_2$—$SiO_2$ glass body of the present invention is described below.

[Heat Treatment Process of $TiO_2$—$SiO_2$ Glass Body]

In the heat treatment process of a $TiO_2$—$SiO_2$ glass body of the present invention, the heat treatment containing a step of holding the $TiO_2$—$SiO_2$ glass body in a temperature region of from $T_1$−90(° C.) to $T_1$−220(° C.) for 120 hours or more is carried out, to thereby reduce distribution of stress caused by striae in the glass body to a level free of the problem in being used as an optical substrate for EUVL.

Here, in the $TiO_2$—$SiO_2$ glass body before the heat treatment, the stress caused by striae must be satisfied with any one of the following (1) and (2).

(1) Standard deviation (dev [σ]) of stress caused by striae is 0.1 MPa or less.

(2) Difference (Δσ) between the maximum value and the minimum value of the stress caused by striae is 0.5 MPa or less.

If the striae are too large in the $TiO_2$—$SiO_2$ glass body before the heat treatment, for example even though the glass body after transparent vitrification is held in a temperature region of from $T_1$−90(° C.) to $T_1$−220(° C.) for 120 hours or more, it is difficult to reduce the distribution of stress caused by striae to a level free of the problem in being used as an optical substrate for EUVL.

In order that the stress caused by striae in the $TiO_2$—$SiO_2$ glass body before the heat treatment is satisfied with any one of the above (1) and (2), the following method, for example, can be employed.

In the step (a) of the production process of a $TiO_2$—$SiO_2$ glass body of the present invention, the temperature of pipes conveying raw materials, particularly a pipe conveying a titania precursor, is securely controlled. More specifically, in the case of gasifying the titania precursor in high concentration by bubbling, it is set such that the temperature of the pipe is higher than the bubbling temperature and the temperature is increased with progressing toward a burner. If a low temperature portion is present in the course of the pipe, the volume of a gas is temporarily decreased in the low temperature portion, unevenness occurs in the concentration of the titania precursor derived to the burner, and the striae may not be satisfied with the above (1) nor (2).

Furthermore, in the step (a) of the production process of a $TiO_2$—$SiO_2$ glass body of the present invention, the temperature of the pipe conveying the titania precursor is preferably controlled to variation width of within $\pm 1°$ C. by PID control. More preferably, the temperature variation width is within $\pm 0.5°$ C. Moreover, not only the temperature of the pipe conveying the titania precursor, the temperature of the pipe conveying the silica precursor is preferably controlled to temperature variation width of within $\pm 1°$ C. by PID control, and the temperature variation is further preferably controlled to within $\pm 0.5°$ C. To warm the pipes, it is preferred to wind a flexible heater such as a ribbon heater or a rubber heater around the pipes in order to uniformly warm the pipes. In order to warm further uniformly, it is preferred to cover the pipes and the heater with an aluminum foil. Furthermore, the outermost layer is preferably covered with a heat-insulating material such as urethane or heat-resistant fiber cloth. Additionally, in order to decrease compositional fluctuation, it is preferred to increase a gas flow rate in the pipes. The gas flow rate is preferably 0.1 msec or more, more preferably 0.3 msec or more, further preferably 0.5 m/sec or more, and particularly preferably 1 msec or more, in terms of a volume in atmospheric pressure conversion at that temperature.

Additionally, in order to feed a gas uniformly, a gas stirring mechanism is preferably provided before feeding the silica precursor and the titania precursor to a burner. As the stirring mechanism, two kinds of mechanisms can be considered, that is, a mechanism which finely divides a gas by a part such as a static mixer or a filter and merges those, and a mechanism which averages fine variations by introducing a gas in a large space and feeds the gas. In order to obtain the $TiO_2$—$SiO_2$ glass of the present invention, the glass is preferably prepared by using at least one of the above stirring mechanisms, and use of the both is more preferred. Of the stirring mechanisms, use of both the static mixer and the filter is preferred.

In the heat treatment process of a $TiO_2$—$SiO_2$ glass body of the present invention, the specific heat treatment process is not particularly limited so long as the $TiO_2$—$SiO_2$ glass body is held in a temperature region of from $T_1-90(°$ C.) to $T_1-220(°$ C.) for 120 hours or more. Therefore, for example, the $TiO_2$—$SiO_2$ glass body may be heated to a certain temperature $T_x$ (for example, $T_1-100(°$ C.)) in the temperature region of from $T_1-90(°$ C.) to $T_1-220(°$ C.), held at the $T_x$ for 120 hours or more, and then naturally cooled. In this case, the temperature of the $TiO_2$—$SiO_2$ glass body is not necessarily required to be always maintained at $T_x$, and heating or cooling may be conducted in the course of the heat treatment. However, in the case of conducting the heating or cooling in the course of the heat treatment, it is necessary to conduct such that the glass body is held in the temperature region of from $T_1-90(°$ C.) to $T_1-220(°$ C.) for 120 hours or more. Alternatively, the $TiO_2$—$SiO_2$ glass body may be heated to a temperature higher than $T_1-90(°$ C.), and subjected to annealing such that the time required to cool the $TiO_2$—$SiO_2$ glass body up to $T_1-220(°$ C.) from $T_1-90(°$ C.) is 120 hours or more. In this case, the same procedures as described in the case of carrying out the step (e) as an annealing step in the production process of a $TiO_2$—$SiO_2$ glass body of the present invention are carried out.

After being held in the temperature region of from $T_1-90(°$ C.) to $T_1-220(°$ C.) for 120 hours or more, the $TiO_2$—$SiO_2$ glass body may be naturally cooled.

As described above, according to the heat treatment process of a $TiO_2$—$SiO_2$ glass body of the present invention, distribution of stress caused by striae in the $TiO_2$—$SiO_2$ glass body can be reduced to a level free of the problem in being used as an optical substrate for EUVL.

Specifically, in the case of the $TiO_2$—$SiO_2$ glass body of (1) described above, that is, the $TiO_2$—$SiO_2$ glass body having a standard deviation (dev [σ]) of stress caused by striae of 0.1 MPa or less, the dev [σ] can be decreased 0.01 MPa or more. The dev [σ] is preferably decreased 0.02 MPa or more, more preferably decreased 0.03 MPa or more, and further preferably decreased 0.04 MPa or more.

In the case of the $TiO_2$—$SiO_2$ glass body of (2) described above, that is, the $TiO_2$—$SiO_2$ glass body having a difference (Δσ) between the maximum value and the minimum value of stress caused by striae of 0.5 MPa or less, the Δσ can be decreased 0.05 MPa or more. The Δσ is preferably decreased 0.06 MPa or more, more preferably decreased 0.07 MPa or more, and further preferably decreased 0.1 MPa or more.

Furthermore, the fictive temperature can be decreased by carrying out the heat treatment process of a $TiO_2$—$SiO_2$ glass body of the present invention. In order to adjust the fictive temperature in the above-described preferred range, the time holding the glass body in the temperature region of from $T_1-90(°$ C.) to $T_1-220(°$ C.) is preferably 300 hours or less, and more preferably 200 hours or less.

Incidentally, the composition of the $TiO_2$—$SiO_2$ glass body to be subjected to a heat treatment process of the present invention is the same as described in the production process of a $TiO_2$—$SiO_2$ of the present invention.

Further, the $TiO_2$—$SiO_2$ glass body after subjected to the heat treatment process of the present invention preferably has the same properties (COT, ΔT, average CTE of from 20 to 100° C., fictive temperature and its variation) as described in the production process of a $TiO_2$—$SiO_2$ of the present invention.

[Optical Substrate for EUVL of the Present Invention]

As described above, the $TiO_2$—$SiO_2$ glass body obtained by the production process of the present invention or the heat treatment process of the present invention is preferred as an optical substrate for EUVL because distribution of stress caused by striae is reduced to a level free of the problem in being used as an optical substrate for EUVL.

Furthermore, the $TiO_2$—$SiO_2$ glass body obtained by the production process of the present invention or the heat treatment process of the present invention has preferred other properties (COT, ΔT, average CTE of from 20 to 100° C., fictive temperature and its variation) as an optical substrate for EUVL as described in the production process of the present invention.

The glass materials constituting the optical substrate for EUVL are required to have excellent resistance characteristics to a cleaning liquid used in cleaning after production of an optical member for EUVL, such as a mask blank or a mirror, using the optical substrate, in cleaning of a mask after patterning the mask blank, and in other cleaning. The $TiO_2$—$SiO_2$ glass body obtained by the production process of the present invention or the heat treatment process of the present invention has excellent resistance characteristics to such cleaning liquids.

Further, the glass materials constituting an optical substrate for EUVL are required to have high rigidity to prevent deformation by film stress of a reflective multilayer film and an absorption layer, formed on an optical surface. The $TiO_2$—$SiO_2$ glass body obtained by the production process of the present invention or the heat treatment process of the present invention has high rigidity, and specifically has specific rigidity of $3 \times 10^7$ m$^2$/s$^2$ or more.

Further, the glass materials constituting an optical substrate for EUVL preferably contains no inclusions of 10 μm or more, more preferably contains no inclusions of 1 μm or more, and further preferably contains no inclusions of 100 nm or more. The inclusions mean foreign matters and bubbles present in a glass. The foreign matters may be generated by contamination and crystal precipitation in the glass preparation step. The TiO$_2$—SiO$_2$ glass body obtained by the production process of the present invention or the heat treatment process of the present invention contains no inclusions of 10 μm or more, preferably contains no inclusions of 1 μm or more, and further preferably contains no inclusions of 100 nm or more.

The optical substrate for EUVL of the present invention is subjected to finish processing such that the optical surface has a desired flatness and surface smoothness. As a high precision processing method used in the finish processing, methods involving beam irradiation or laser light irradiation to a surface of a glass substrate such as ion beam etching, gas cluster ion beam etching, plasma etching or nanoabrasion by laser light irradiation are preferably used. However, the method is not limited to those, and mechanical polishing using polishing slurry may be used so long as the finish processing can be conducted so that the optical surface has the desired flatness and surface flatness.

As described above, in the optical substrate for EUVL of the present invention, distribution of stress caused by striae is reduced to a level free of the problem in being used as an optical substrate for EUVL. Therefore, in conducting the final processing to the optical surface, the influence by the distribution of stress is reduced, and extremely smooth optical surface can be obtained. Specifically, the optical substrate for EUVL of the present invention preferably has PV value of surface roughness of an optical surface after finish processing of 30 nm or less, more preferably 20 nm or less, further preferably 10 nm or less, and particularly preferably 9 nm or less, as MSFR (Mid-Spatial Frequency Roughness) having wavy pitch in a range of from 10 μm to 1 mm, which is an index showing smoothness in a polished surface.

Further, in the optical substrate for EUVL of the present invention, flatness of an optical surface after finish processing is, in terms of PV value, preferably 100 nm or less, more preferably 50 nm or less, and further preferably 30 nm or less.

Further, the optical substrate for EUVL of the present invention preferably contains no defects having the greatest dimension of 60 nm on the optical surface after finish processing, more preferably contains no defects of 50 nm or more, and further preferably contains no defects of 40 nm or more.

EXAMPLES

The present invention is described in more detail below by reference to the Examples, but the present invention is not construed as being limited thereto.

Examples 1, 2 and 4-7 are Inventive Examples, and Example 3 is Comparative Example.

Example 1

TiO$_2$—SiO$_2$ glass fine particles obtained by gasifying TiCl$_4$ and SiCl$_4$ each serving as a glass forming material of a TiO$_2$—SiO$_2$ glass, respectively, mixing those and subjecting to heat hydrolysis (flame hydrolysis) in oxyhydrogen flame were deposited and grown on a substrate to form a porous TiO$_2$—SiO$_2$ glass body. Here, both a static mixer and a filter were provided as stirring mechanism for raw material gasses short of feeding TiCl$_4$ and SiCl$_4$ to a burner (step (a)).

Since it is hard to handle the porous TiO$_2$—SiO$_2$ glass body obtained without any treatment, the porous TiO$_2$—SiO$_2$ glass body was held in the air at 1,200° C. for 4 hours in the state still deposited on the substrate, and then separated from the substrate.

Thereafter, the porous TiO$_2$—SiO$_2$ glass body was held at 1,450° C. for 4 hours under reduced pressure, to thereby obtain a TiO$_2$—SiO$_2$ dense body (step (b)).

The TiO$_2$—SiO$_2$ dense body obtained was placed in a carbon mold, and held at 1,680° C. for 4 hours, thereby performing transparent vitrification and primary molding. Thus, a transparent TiO$_2$—SiO$_2$ glass body primarily molded was obtained (step (c) and step (d-1)).

The transparent TiO$_2$—SiO$_2$ glass body obtained was again placed in the carbon mold, and held at 1,700° C. for 4 hours, thereby performing secondary molding to obtain a molded TiO$_2$—SiO$_2$ glass body (step (d-2)). Then, the molded TiO$_2$—SiO$_2$ glass body was directly cooled to 1,000° C. in the furnace at a rate of 10° C./hr, held at 1,000° C. for 3 hours, cooled to 950° C. at a rate of 10° C./hr, held at 950° C. for 72 hours, cooled to 900° C. at a rate of 5° C./hr, held at 900° C. for 72 hours, and cooled to room temperature, thereby obtaining a molded TiO$_2$—SiO$_2$ body (step (e)).

In this case, an annealing point $T_1$ of the TiO$_2$—SiO$_2$ body was 1,100° C. Therefore, the time that the TiO$_2$—SiO$_2$ body was held in the temperature region of from $T_1$−90(° C.) to $T_1$−220(° C.) in the step (e) was 163 hours, and the average temperature decreasing rate in cooling the TiO$_2$—SiO$_2$ body up to $T_1$−220(° C.) from $T_1$−90(° C.) was 0.8° C./hr.

Example 2

After completion of the step (d-2) in Example 1, the step (e) was not conducted, and instead, the molded TiO$_2$—SiO$_2$ body obtained by conducting natural cooling (average temperature decreasing rate: about 160° C./hr) up to room temperature in an electric furnace was subjected to the heat treatment in the following procedures.

The molded TiO$_2$—SiO$_2$ body was heated to 1,000° C. in an electric furnace, held at 1,000° C. for 3 hours, cooled to 950° C. at a rate of 10° C./hr, held at 950° C. for 72 hours, cooled to 900° C. at a rate of 5° C./hr, held at 900° C. for 72 hours, and then cooled to room temperature.

In the above heat treatment, the time that the TiO$_2$—SiO$_2$ body was held in a temperature region of from $T_1$−90(° C.) to $T_1$−220(° C.) is 162 hours, and the average temperature decreasing rate in cooling the TiO$_2$—SiO$_2$ body up to $T_1$−220(° C.) from $T_1$−90(° C.) is 0.80° C./hr.

Example 3

After completion of the step (d-2) in Example 1, the step (e) was not conducted, and instead, the TiO$_2$—SiO$_2$ body was naturally cooled (average temperature decreasing rate: about 160° C./hr) up to room temperature in an electric furnace to obtain a molded TiO$_2$—SiO$_2$ body.

Example 4

TiO$_2$—SiO$_2$ glass fine particles obtained by gasifying TiCl$_4$ and SiCl$_4$ each serving as a glass forming material of a TiO$_2$—SiO$_2$ glass, respectively, mixing those and subjected to heat hydrolysis (flame hydrolysis) in oxyhydrogen flame were deposited and grown on a substrate to form a porous $TiO_2$—$SiO_2$ glass body (step (a)).

Since it is hard to handle the porous $TiO_2$—$SiO_2$ glass body obtained without any treatment, the porous $TiO_2$—$SiO_2$ glass body is held in the air at 1,200° C. for 4 hours in the state still deposited on the substrate, and then separated from the substrate.

Thereafter, the porous $TiO_2$—$SiO_2$ glass body is placed in an atmosphere-controllable electric furnace, and the pressure in the furnace is reduced to 1,300 Pa at room temperature. Water is placed in a glass made-bubbler, and bubbling is conducted with He gas at 80° C. under the atmospheric pressure. While introducing the water vapor in the furnace together with He gas, the porous $TiO_2$—$SiO_2$ glass body is held in this atmosphere at 1,000° C. for 4 hours under ordinary pressure for 4 hours (step (b-1)).

Thereafter, the porous $TiO_2$—$SiO_2$ glass body was heated to 1,450° C. in the same atmosphere, and held at this temperature for 4 hours, thereby obtaining a $TiO_2$—$SiO_2$ dense body containing OH group (step (b-2)).

The $TiO_2$—$SiO_2$ dense body obtained was placed in a carbon mold, and held at 1,630° C. for 4 hours, thereby performing transparent vitrification and primary molding, to obtain a transparent $TiO_2$—$SiO_2$ glass body primarily molded (step (c) and step (d-1)).

The transparent $TiO_2$—$SiO_2$ glass body obtained was again placed in the carbon mold, and held at 1,650° C. for 4 hours, thereby performing secondary molding, to obtain a molded $TiO_2$—$SiO_2$ glass body (step (d-2)). Then, the glass body was directly cooled to 900° C. in the furnace at a rate of 10° C./hr, held at 900° C. for 3 hours, cooled to 850° C. at a rate of 10° C./hr, held at 850° C. for 72 hours, cooled to 800° C. at a rate of 5° C./hr, held at 800° C. for 72 hours, and cooled to room temperature, thereby obtaining a molded $TiO_2$—$SiO_2$ body (step (e)).

In this case, an annealing point $T_1$ of the $TiO_2$—$SiO_2$ body was 980° C. Therefore, the time that the $TiO_2$—$SiO_2$ body was held in the temperature region of from $T_1$-90(° C.) to $T_1$-220(° C.) in the step (e) was 158 hours, and the average temperature decreasing rate in cooling the $TiO_2$—$SiO_2$ body up to $T_1$-220(° C.) from $T_1$-90(° C.) was 0.82° C./hr.

Example 5

After completion of the step (d-2) in Example 4, the step (e) was not conducted, and instead, the molded $TiO_2$—$SiO_2$ body obtained by conducting natural cooling (average temperature decreasing rate: about 160° C./hr) to room temperature in an electric furnace was subjected to the heat treatment in the following procedures.

The molded $TiO_2$—$SiO_2$ body was heated to 900° C. in an electric furnace, held at 900° C. for 3 hours, cooled to 850° C. at a rate of 10° C./hr, held at 850° C. for 72 hours, cooled to 800° C. at a rate of 5° C./hr, held at 800° C. for 72 hours, and then cooled to room temperature.

In the above heat treatment, the time that the $TiO_2$—$SiO_2$ body was held in a temperature region of from $T_1$-90(° C.) to $T_1$-220(° C.) is 158 hours, and the average temperature decreasing rate in cooling the $TiO_2$—$SiO_2$ body up to $T_1$-220(° C.) from $T_1$-90(° C.) was 0.82° C./hr.

Example 6

$TiO_2$—$SiO_2$ glass fine particles obtained by gasifying $TiCl_4$ and $SiCl_4$ each serving as a glass forming material of a $TiO_2$—$SiO_2$ glass, respectively, mixing those and subjected to heat hydrolysis (flame hydrolysis) in oxyhydrogen flame were deposited and grown on a substrate to form a porous $TiO_2$—$SiO_2$ glass body (step (a)).

Since it is hard to handle the porous $TiO_2$—$SiO_2$ glass body obtained without any treatment, the porous $TiO_2$—$SiO_2$ glass body is held in the air at 1,200° C. for 4 hours in the state still deposited on the substrate, and then separated from the substrate.

Thereafter, the porous $TiO_2$—$SiO_2$ glass body obtained is supported on a PFA-made jig, and placed in a nickel-made autoclave together with the jig. Subsequently, NaF pellets (manufactured by Stella Chemifa Corporation) are inserted in the autoclave so as not to contact with the porous $TiO_2$—$SiO_2$ glass body, and the autoclave is heated to 80° C. from the outside thereof using an oil bath. While maintaining the inside of the apparatus at 80° C., vacuum deaeration is conducted until the pressure in the apparatus reaches 266 Pa or less in absolute pressure, and the system is maintained for 1 hour. Subsequently, a gas of elemental fluorine ($F_2$) diluted to 20% by volume with a nitrogen gas is introduced until the pressure in the apparatus reaches 0.18 MPa in gauge pressure. The glass body was heated to 80° C., and held for 24 hours, thereby introducing fluorine in the porous $TiO_2$—$SiO_2$ glass body (step (b-1)).

Thereafter, the porous $TiO_2$—$SiO_2$ glass body was held at 1,450° C. for 4 hours under reduced pressure to obtain a $TiO_2$—$SiO_2$ dense body (step (b-2)).

The $TiO_2$—$SiO_2$ dense body obtained was placed in a carbon mold, and held at 1,630° C. for 4 hours, thereby performing transparent vitrification and primary molding, to obtain a transparent $TiO_2$—$SiO_2$ glass body primarily molded (step (c) and step (d-1)).

The transparent $TiO_2$—$SiO_2$ glass body obtained was again placed in the carbon mold, and held at 1,650° C. for 4 hours, thereby performing secondary molding, to obtain a molded $TiO_2$—$SiO_2$ glass body (step (d-2)). Then, the glass body was directly cooled to 900° C. in the furnace at a rate of 10° C./hr, held at 900° C. for 3 hours, cooled to 850° C. at a rate of 10° C./hr, held at 850° C. for 72 hours, cooled to 800° C. at a rate of 5° C./hr, held at 800° C. for 72 hours, and then cooled to room temperature, thereby obtaining a molded $TiO_2$—$SiO_2$ body (step (e)).

In this case, an annealing point $T_1$ of the $TiO_2$—$SiO_2$ body was 1,010° C. Therefore, the time that the $TiO_2$—$SiO_2$ body was held in the temperature region of from $T_1$-90(° C.) to $T_1$-220(° C.) in the step (e) was 164 hours, and the average temperature decreasing rate in cooling the $TiO_2$—$SiO_2$ body up to $T_1$-220(° C.) from $T_1$-90(° C.) was 0.79° C./hr.

Example 7

After completion of the step (d-2) in Example 6, the step (e) was not conducted, and instead, the molded $TiO_2$—$SiO_2$ body obtained by conducting natural cooling (average temperature decreasing rate: about 160° C./hr) to room temperature in an electric furnace was subjected to the heat treatment in the following procedures.

The molded $TiO_2$—$SiO_2$ body was heated to 900° C. in an electric furnace, held at 900° C. for 3 hours, cooled to 850° C. at a rate of 10° C./hr, held at 850° C. for 72 hours, cooled to 800° C. at a rate of 5° C./hr, held at 800° C. for 72 hours, and then cooled to room temperature.

In the above heat treatment, the time that the $TiO_2$—$SiO_2$ body was held in a temperature region of from $T_1$-90(° C.) to $T_1$-220(° C.) is 162 hours, and the average temperature decreasing rate in cooling the $TiO_2$—$SiO_2$ body up to $T_1$-220(° C.) from $T_1$-90(° C.) was 0.8° C./hr.

The $TiO_2$—$SiO_2$ glass bodies prepared in Examples 1 to 7 above each was cut into a plate of about 153.0 mm long× about 153.0 mm wide×about 6.75 mm thick using an inner diameter saw slicer, to thereby prepare 40 plate members. Subsequently, these plate members were chamfered using #120 diamond whetstone by the commercially available NC chamfering machine such that external dimensions of length and width were about 152 mm each, and chamfered width was 0.2 to 0.4 mm.

Then, the major front surface (surface on which a multi-layer film or absorption layer is to be formed) of the plate members is polished with #400 SiC abrasive as an abrasive material by 20B double side lapping machine (manufactured by SpeedFam) until the thickness become about 6.63 mm.

Subsequently, as primary polishing, the plate materials are polished about 50 μm in total in both surfaces with a slurry comprising cerium oxide as a main component as an abrasive by 20B double side polishing machine. Further, as secondary polishing, the plate materials are polished about 10 μm in both surfaces with a slurry comprising cerium oxide as a main component as an abrasive by 20B double side polishing machine, and then, subjected to final polishing (third polishing) with another polishing machine. In the final polishing, colloidal silica (CONPOL 20, trade name, manufactured by Fujimi Corporation) is used as an abrasive.

Subsequently, the plate materials of each group are washed with a multi-stage automatic cleaning machine comprising a first tank containing a hot solution of sulfuric acid and hydrogen peroxide solution and a third tank containing a neutral surfactant solution.

Properties of plate materials after washed were evaluated. The results are shown in Table 1. In this case, fictive temperature, OH content, F content, dev [σ], and Δσ were measured according to the methods described above. The dev [σ] of the molded $TiO_2$—$SiO_2$ body before heat treatment was measured in Examples 2, 5 and 7. Further, annealing point and $TiO_2$ content were measured by the following procedures.

Annealing point: Viscosity of a glass is measured with a beam bending method according to the method defined in JIS R3103-2: 2001, and the temperature at which the viscosity η becomes $10^{13}$ dPa·s is taken as an annealing point.

$TiO_2$ content: Ti-Kα strength is measured, and converted by a fundamental parameter method.

Further, regarding the plate materials after washed, MSFR is measured by the following procedure.

MSFR: To a plate-shaped sample of about 152 mm×152 mm, an entire surface shape of the substrate was measured with a non-contact type surface profiler (manufactured by ZYGO, New View) at a interval of 1 mm on a line passing the center of the sample and parallel to the edge thereof. For the measurement, an objective lens of 2.5 magnifications was used, and by conducting data treatment using a band pass filer having a wavelength of 10 μm to 1 mm, wavy components having wavelengths other than the same wavelength region were removed, and PV value of surface roughness was obtained as MSFR.

TABLE 1

|  | Fictive temperature (° C.) | Annealing point (° C.) | $TiO_2$ (wt %) | OH (wt ppm) | F (wt ppm) | dev [σ] (MPa) | Δσ (MPa) | MSFR (nm) |
|---|---|---|---|---|---|---|---|---|
| Example 1 | 960 | 1100 | 7.1 | 60 | — | 0.04 | 0.17 | 8.9 |
| Example 2 | 960 | 1100 | 7.1 | 60 | — | 0.04 | 0.16 | 8.8 |
| Example 3 | 1060 | 1100 | 7.1 | 60 | — | 0.07 | 0.24 | 13.4 |
| Example 4 | 790 | 980 | 7.6 | 730 | — | 0.03 | 0.14 | 8.7 |
| Example 5 | 790 | 980 | 7.6 | 730 | — | 0.03 | 0.14 | 8.8 |
| Example 6 | 870 | 1010 | 6.7 | <10 | 4000 | 0.04 | 0.17 | 9.1 |
| Example 7 | 870 | 1010 | 6.7 | <10 | 4000 | 0.04 | 0.17 | 9.0 |

The dev [σ] of the molded $TiO_2$—$SiO_2$ body before heat treatment in Examples 2, 5 and 7 were 0.07 MPa, and Δσ thereof were 0.24 MPa.

The plate materials of Examples 1, 2 and 4 to 7 were examined with a surface defect inspection machine for photomask (manufactured by Lasertec Corporation, M1350). As a result, defects having a size of 60 nm or more were not present.

While the present invention has been described in detail and with reference to the specific embodiments thereof, it will be apparent to one skilled in the art that various modifications or changes can be made without departing from the spirit and scope thereof.

This application is based on Japanese Patent Application No. 2009-116488 filed on May 13, 2009, and the entire contents of which are incorporated herein by reference.

The invention claimed is:

1. A process for production of a $TiO_2$—$SiO_2$ glass body, comprising carrying out a transparent vitrification step, a molding step and an annealing step, wherein the transparent vitrification step and the molding step are conducted sequentially or simultaneously, and wherein
when an annealing point of a $TiO_2$—$SiO_2$ glass body after the transparent vitrification step is taken as $T_1$ (° C.), the glass body after the transparent vitrification step and in the annealing step is held in a temperature region of from $T_1-90$ (° C.) to $T_1-220$ (° C.) for 120 hours or more, and when $T_1-220$ (° C.) is reached, the glass body is naturally cooled.

2. The process for production of a $TiO_2$—$SiO_2$ glass body according to claim 1, wherein a step of cooling the glass body after transparent vitrification up to $T_1-220$ (° C.) from $T_1-90$ (° C.) in an average temperature decreasing rate of 1 ° C/hr or less is carried out as the step of holding the glass body after transparent vitrification in a temperature region of from $T_1-90$ (° C.) to $T_1-220$ (° C.) for 120 hours or more.

3. The process for production of a $TiO_2$—$SiO_2$ glass body according to claim 1, which provides a $TiO_2$—$SiO_2$ glass body having a standard deviation (dev[σ]) of stress caused by striae of 0.05 MPa or less.

4. The process for production of a $TiO_2$—$SiO_2$ glass body according to claim 1, which provides a $TiO_2$—$SiO_2$ glass body having a difference (Δσ) between the maximum value and the minimum value of stress caused by striae of 0.23 MPa or less.

5. The process for production of a $TiO_2$—$SiO_2$ glass body according to claim 1, which provides a $TiO_2$—$SiO_2$ glass body of which a TiO$_2$ content is from 3 to 12% by mass and a temperature at which a coefficient of linear thermal expansion becomes 0 ppb/° C. is within a range of from 0 to 110° C.

6. The process for production of a TiO$_2$—SiO$_2$ glass body according to claim 1, which provides a TiO$_2$—SiO$_2$ glass body of which a fictive temperature exceeds 950° C. and is lower than 1,150° C.

7. A heat treatment process of a TiO$_2$—SiO$_2$ glass body, comprising carrying out a heat treatment containing a step of, when annealing point of a TiO$_2$—SiO$_2$ glass body to be heat-treated is taken as T$_1$ (° C.), holding a TiO$_2$—SiO$_2$ glass body, which has standard deviation (dev [σ]) of stress caused by striae of 0.1 MPa or less, in a temperature region of from T$_1$−90 (° C.) to T$_1$−220 (° C.) for 120 hours or more to 300 hours or less, and then naturally cooling the glass body, thereby decreasing the standard deviation (dev [σ]) of stress 0.01 MPa or more lower than that before carrying out the heat treatment.

8. The heat treatment process of a TiO$_2$—SiO$_2$ glass body according to claim 7, wherein, after heating the glass body to a temperature of T$_1$−90 (° C.) or more, a step of cooling the glass body up to T$_1$−220 (° C.) from T$_1$−90 (° C.) at an average temperature decreasing rate of 1 ° C/hr or less is carried out as the heat treatment.

9. The heat treatment process of a TiO$_2$—SiO$_2$ glass body according to claim 7, wherein the TiO$_2$—SiO$_2$ glass body has a TiO$_2$ content of from 3 to 12% by mass, and has a temperature at which a coefficient of linear thermal expansion of the TiO$_2$—SiO$_2$ glass body after the heat treatment becomes 0 ppb/° C. being within a range of from 0 to 110° C.

10. The heat treatment process of a TiO$_2$—SiO$_2$ glass body according to claim 7, wherein the TiO$_2$—SiO$_2$ glass body has, after the heat treatment, a fictive temperature of more than 950° C. and less than 1,150° C.

11. A heat treatment process of a TiO$_2$—SiO$_2$ glass body, comprising carrying out a heat treatment containing a step of, when annealing point of a TiO$_2$—SiO$_2$ glass body to be heat-treated is taken as T$_1$ (° C.), holding a TiO$_2$—SiO$_2$ glass body, which has a difference (Δσ) between the maximum value and the minimum value of stress caused by striae of 0.5 MPa or less, in a temperature region of from T$_1$−90 (° C.) to T$_1$−220 (° C.) for 120 hours or more to 300 hours or less, and then naturally cooling the glass body, thereby decreasing the difference (Δσ) between the maximum value and the minimum value of stress 0.05 MPa or more lower than that before carrying out the heat treatment.

12. The heat treatment process of a TiO$_2$—SiO$_2$ glass body according to claim 11, wherein, after heating the glass body to a temperature of T$_1$−90 (° C.) or more, a step of cooling the glass body up to T$_1$−220 (° C.) from T$_1$−90 (° C.) at an average temperature decreasing rate of 1 ° C/hr or less is carried out as the heat treatment.

13. The heat treatment process of a TiO$_2$—SiO$_2$ glass body according to claim 11, wherein the TiO$_2$—SiO$_2$ glass body has a TiO$_2$ content of from 3 to 12% by mass, and has a temperature at which a coefficient of linear thermal expansion of the TiO$_2$—SiO$_2$ glass body after the heat treatment becomes 0 ppb/° C. being within a range of from 0 to 110° C.

14. The heat treatment process of a TiO$_2$—SiO$_2$ glass body according to claim 11, wherein the TiO$_2$—SiO$_2$ glass body has, after the heat treatment, a fictive temperature of more than 950° C. and less than 1,150° C.

* * * * *